United States Patent
Delarue et al.

(10) Patent No.: US 9,135,372 B2
(45) Date of Patent: Sep. 15, 2015

(54) PROCESS FOR SELECTING OBJECTS IN A PLM DATABASE AND APPARATUS IMPLEMENTING THIS PROCESS

(75) Inventors: Guillaume Delarue, Courbevoie (FR); Arnaud Nonclercq, Suresnes (FR)

(73) Assignee: DASSAULT SYSTEMES, Suresnes Cedex (FR)

( * ) Notice: Subject to any disclaimer, the term of this patent is extended or adjusted under 35 U.S.C. 154(b) by 405 days.

(21) Appl. No.: 11/646,725

(22) Filed: Dec. 28, 2006

(65) Prior Publication Data

US 2007/0159480 A1    Jul. 12, 2007

(51) Int. Cl.
| | |
|---|---|
| *G09G 5/00* | (2006.01) |
| *G06F 17/50* | (2006.01) |
| *G06F 3/0482* | (2013.01) |
| *G06T 17/00* | (2006.01) |
| *G06T 19/00* | (2011.01) |
| *G06F 17/30* | (2006.01) |
| *G06T 11/00* | (2006.01) |
| *G06T 15/04* | (2011.01) |
| *G06F 3/14* | (2006.01) |
| *G06T 15/00* | (2011.01) |
| *G06F 9/44* | (2006.01) |

(52) U.S. Cl.
CPC ............. *G06F 17/50* (2013.01); *G06F 3/0482* (2013.01); *G06F 17/30271* (2013.01); *G06T 17/005* (2013.01); *G06T 19/00* (2013.01); *G06F 3/14* (2013.01); *G06F 9/4443* (2013.01); *G06T 11/001* (2013.01); *G06T 15/005* (2013.01); *G06T 15/04* (2013.01); *G06T 2200/24* (2013.01)

(58) Field of Classification Search
CPC ..... G06T 11/001; G06T 15/04; G06T 15/005; G06F 9/4443; G06F 3/14
USPC .............. 715/752, 751, 961, 964; 700/90, 95, 700/117, 159, 180, 182; 345/419, 427, 619
See application file for complete search history.

(56) References Cited

U.S. PATENT DOCUMENTS

| | | | | |
|---|---|---|---|---|
| 5,432,894 | A | * | 7/1995 | Funaki .......................... 345/419 |
| 5,485,390 | A | * | 1/1996 | LeClair et al. ................ 700/182 |
| 5,619,630 | A | * | 4/1997 | Minami et al. ................ 345/619 |

(Continued)

FOREIGN PATENT DOCUMENTS

| | | |
|---|---|---|
| JP | 05054087 | 3/1993 |
| JP | 06215133 | 8/1994 |

(Continued)

OTHER PUBLICATIONS

Zhang, C., et al., "Spatio-Temporal Issues in Infrastructure Lifecycle Management Systems", 1st CSCE Specialty Conference on Infrastructure Technologies, Management and Policy, Jun. 2, 2005, pp. 131-1-131-10.

(Continued)

*Primary Examiner* — Abderrahim Merouan
(74) *Attorney, Agent, or Firm* — Baker and Hostetler LLP

(57) ABSTRACT

The invention is directed to a process, an apparatus and a program for selecting objects in a PLM database containing modeled objects. The invention allows a user to rapidly display a view of the set of objects while allowing for selecting objects in the view, without the need for loading the complete and exact representations of all the objects of the view when the user is looking for particular objects to work on.

24 Claims, 7 Drawing Sheets

(56) References Cited

U.S. PATENT DOCUMENTS

| | | | |
|---|---|---|---|
| 5,815,154 A * | 9/1998 | Hirschtick et al. | 715/853 |
| 5,861,889 A * | 1/1999 | Wallace et al. | 345/619 |
| 5,982,382 A | 11/1999 | Benzel et al. | |
| 6,057,847 A * | 5/2000 | Jenkins | 345/422 |
| 6,100,897 A * | 8/2000 | Mayer et al. | 345/428 |
| 6,219,049 B1 * | 4/2001 | Zuffante et al. | 715/764 |
| 6,219,055 B1 * | 4/2001 | Bhargava et al. | 715/850 |
| 6,285,369 B1 * | 9/2001 | Kross et al. | 345/419 |
| 6,337,700 B1 * | 1/2002 | Kinoe et al. | 715/854 |
| 6,611,725 B1 * | 8/2003 | Harrison et al. | 700/98 |
| 6,654,027 B1 * | 11/2003 | Hernandez | 345/619 |
| 6,750,859 B2 * | 6/2004 | Sowizral et al. | 345/418 |
| 6,862,493 B2 * | 3/2005 | Matsubara et al. | 700/182 |
| 6,868,297 B1 * | 3/2005 | Rimoldi et al. | 700/98 |
| 6,898,560 B1 * | 5/2005 | Das | 703/7 |
| 6,906,712 B2 * | 6/2005 | Lee et al. | 345/420 |
| 6,907,573 B2 * | 6/2005 | Kohls et al. | 715/764 |
| 6,965,846 B2 * | 11/2005 | Krimmer | 703/2 |
| 7,068,271 B2 * | 6/2006 | Dennis et al. | 345/420 |
| 7,079,990 B2 * | 7/2006 | Haller et al. | 703/2 |
| 7,127,308 B2 * | 10/2006 | Bigelow | 700/97 |
| 7,324,103 B2 * | 1/2008 | Stewart et al. | 345/420 |
| 7,479,959 B2 * | 1/2009 | Han et al. | 345/420 |
| 7,502,027 B1 * | 3/2009 | Chin et al. | 345/427 |
| 7,672,822 B2 * | 3/2010 | Lee et al. | 703/7 |
| 7,840,443 B2 * | 11/2010 | Lukis et al. | 705/26.4 |
| 2002/0107673 A1 * | 8/2002 | Haller et al. | 703/1 |
| 2002/0180735 A1 * | 12/2002 | Chartier et al. | 345/440 |
| 2003/0033041 A1 * | 2/2003 | Richey | 700/98 |
| 2004/0193566 A1 * | 9/2004 | Kothuri | 707/1 |
| 2005/0055181 A1 * | 3/2005 | Verdura et al. | 703/1 |
| 2005/0080502 A1 * | 4/2005 | Chernyak et al. | 700/97 |
| 2005/0108215 A1 * | 5/2005 | Thomas et al. | 707/3 |
| 2005/0203718 A1 * | 9/2005 | Carek et al. | 703/1 |
| 2005/0223337 A1 | 10/2005 | Wheeler et al. | |
| 2005/0237322 A1 * | 10/2005 | Minami et al. | 345/419 |

FOREIGN PATENT DOCUMENTS

| | | |
|---|---|---|
| JP | 2002366974 | 12/2002 |
| WO | WO-00/04433 A2 | 1/2000 |

OTHER PUBLICATIONS

Kelleghan, Mike, "Octree Partitioning Techniques", Aug. 1997, http://www.gamasutra.com/features/19970807/octree.html.

Ding, S., et al., "Oriented bounding box and octree based global interference detection in 5-axis machining of free-form surfaces", Computer-Aided Design, Nov. 2004, vol. 36, No. 13, pp. 1281-1294.

Tan, Tiow-Seng, et al., "Computer Bounding Volume Hierarchies Using Model Simplification", Proceedings of the 1999 Symposium on Interactive 3D Graphics, Atlanta, GA, Apr. 26-28, 1999, pp. 63-69.

* cited by examiner

PROCESS FOR SELECTING OBJECTS IN A PLM DATABASE AND APPARATUS IMPLEMENTING THIS PROCESS

RELATED APPLICATION

This application claims priority to European Application No. 05028720.0, filed Dec. 30, 2005.

FIELD OF THE INVENTION

The invention relates to the field of computer-implemented methods and systems, and more specifically to product life cycle management solutions, which contain databases of data representative of modeled objects.

BACKGROUND OF THE INVENTION

A number of systems and solutions are offered on the market for the design of parts or assemblies of parts, such as the one provided by DASSAULT SYSTEMES under the trademark CATIA. These so-called computer-aided design (CAD) systems allow a user to construct, manipulate and view complex three-dimensional (3D) models of objects or assemblies of objects. CAD systems provide a representation of modeled objects using edges or lines, in certain cases with faces. Lines or edges may be represented in various manners, e.g. non-uniform rational B-splines (NURBS). These CAD systems manage parts or assemblies of parts as modeled objects, which are essentially specifications of geometry. Specifically, CAD files contain specifications, from which a geometry is generated, and from geometry a representation is generated. Specifications, geometry and representation may be stored in a single CAD file or multiple ones. CAD systems include graphic tools for representing the modeled objects to the designers; these tools are dedicated to the display of complex objects—the typical size of a file representing an object in a CAD system being in the range of a Mega-byte for part, and an assembly may comprise thousands of parts. A CAD system manages models of objects, which are stored in electronic files.

There also exists product life cycle management (PLM) solutions, such as the one provided by DASSAULT SYSTEMES under the trademarks CATIA, ENOVIA and DELMIA; these solutions provide an engineering hub, which organizes product engineering knowledge, a manufacturing hub, which manages manufacturing engineering knowledge, and an enterprise hub which enables enterprise integrations and connections into both the engineering and manufacturing hubs. All together the systems delivers an open object model linking products, processes, resources to enable dynamic, knowledge-based product creation and decision support that drives optimized product definition, manufacturing preparation, production and service.

Such PLM solutions comprise a relational database of products. A database is usually defined as a collection of data (typically data and relations between the data) organized for rapid search and retrieval. Databases are structured to facilitate storage, retrieval, modification, and deletion of data in conjunction with various data-processing operations. Databases generally consists of a file or set of files that can be broken down into records, each of which consist of one or more fields. Fields are the basic units of data storage. Users retrieve database information primarily through queries. Using keywords and sorting commands, users can rapidly search, rearrange, group, and select the field in many records to retrieve or create reports on particular aggregates of data according to the rules of the database management system being used.

One of the problems with PLM solutions is that the users of the system may wish to work on one or more objects such as a part or an assembly of parts of a more complex product, and thus has to select said desired parts to edit, modify, view them, etc.

One solution to this problem relies on loading in the client computer memory the whole model corresponding to the assembly of said objects, including a three dimensional graphic representation of the model and all the information on said objects such as geometry, constraints . . . , but also hyperlinks to other objects. Thus, selection of individual parts is possible. However, owing to the typical size of a file representing a product in a CAD system (an product such as an airplane is likely to contain millions of parts), the rendering time of a view of said object may be cripplingly long. In addition, virtual camera is impossible, for similar reasons.

Solutions to limit the scope of the search exist.

A first method uses proximity queries. Here the user enters a proximity value; the query then retrieves all elements in the database having a clearance corresponding to this value. That method requires a perfect knowledge of the model from the user.

The second method relies on volume queries. Here the user graphically defines a volume (a cube, a sphere . . . ), for example by drawing said volume directly via a user pointer or a dedicated interface. Then, according to the selected option (e.g. "included/intersected"), the query then retrieves from database all elements that are included in and/or intersected by the volume.

Nevertheless, those methods require all to first load the whole model which is, as seen above, time and resources consuming.

Such drawbacks may be by-passed by a semantic approach, provided the user knows by heart complex filenames of the part or the like. Such a solution is obviously not tenable, all the more in the field of PLM, wherein millions of parts are likely to compose an object.

There is therefore a need for a solution allowing a user to rapidly select objects from a set of objects stored in a database, using a graphical representation of said objects.

SUMMARY OF THE INVENTION

The invention provides processes, an apparatus and a program for selecting objects in a database that address the above stated needs.

In one embodiment, the invention therefore provides a process for selecting objects in a PLM database containing modeled objects, the process comprising:
  providing a graphical user interface;
  displaying on the graphical user interface a view of a set of objects of the database, said view being a non-associative view;
  defining a volume in the displayed view;
  searching the database and identifying to the user objects of the view intersecting said defined volume.

In other embodiments, the process according to the invention may comprise one or more of the following features:
  the step of identifying objects comprises retrieving from the database the exact representation of said identified objects;
  the step of identifying further comprises applying to non-identified objects of the non-associative view rendering parameters that are different from the rendering parameters of the identified object;

the rendering parameters applied to the non-identified objects of the non-associative view comprise rendering translucent all non-identified objects of the non-associative view;

the process further comprises, prior to the step of displaying, a step of aggregating representations of respective objects of the set of objects to form the non-associative displayed view;

the step of searching and identifying further comprises identifying one or more bounding volume of respective objects of the set and intersecting the defined volume;

the process further comprises, prior to the step of displaying the non-associative view, a step of computing and storing in the PLM database the bounding volumes of respective objects;

at the step of computing and storing bounding volumes, only one bounding volume is stored for multi-instantiated objects of the set of objects;

the step of identifying one or more intersecting bounding volume is carried out recursively, based on relations stored in the database between the respective objects;

the process further comprises, prior to the step of displaying, the step of computing and storing in the PLM database subdivided bounding volumes of respective bounding volumes;

the process further comprises a step of identifying one or more subdivided bounding volume intersecting the defined volume;

the non-associative displayed view is a view of a set of three-dimensional objects;

upon activation of a user-selectable area, said identified objects are loaded on an authoring tool in order to be edited;

the objects in contact with the identified objects are also identified;

the volume is defined through a drag and drop movement of a pointer in the displayed non-associative view;

the volume is defined by an offset of the volume of an identified object of the view, said object being identified through the computation of the intersection between the set of objects in the view and a computed ray passing through the viewpoint of the view and a location of a pointer in the view;

the identification of the identified objects is updated upon movement of the defined volume in the non-associative view.

In yet another embodiment, the invention provides an apparatus for selecting an object in a PLM database containing modeled objects, the apparatus comprising:

means for providing a graphical user interface on a display;

means for displaying on the graphical user interface a view of a set of objects of the database, said view being a non-associative view;

means for defining a volume in the view; and means for searching the database and for identifying to the user objects intersecting the defined volume.

In other embodiments, the apparatus may comprise one or more of the following features:

the means for identifying objects comprise means for retrieving from the database the exact representation of said identified objects;

the apparatus further comprises means for loading said identified object on an authoring tool in order to be edited, upon activation of user-selectable area.

In still another embodiment, the invention provides a computer program, stored on a computer readable medium, for selecting an object in a PLM database containing modeled objects, comprising code means for causing a computer onto which said computer program is loaded to take the steps of:

providing a graphical user interface;

displaying on the graphical user interface a view of a set of objects of the database, said view being a non-associative view;

defining a volume in the view; and searching the database and identifying to the user objects intersecting said defined volume.

In one embodiment of the computer program, the code means causing the computer to take the step of identifying objects comprise code means for causing the computer to take the step of retrieving from the database the exact representation of said identified objects.

In one embodiment, the computer program comprises code means for causing the computer, upon activation of user-selectable area, to take the step of loading said identified objects on an authoring tool in order to be edited.

The invention further concerns an apparatus and a computer program implementing the process of the invention.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

The invention is directed to a process for selecting objects in a PLM database containing modeled objects. The user is provided with a graphical user interface with a user-controlled pointer. The process comprises displaying on the graphical user interface a view of a set of objects of the database—preferably a three dimensional view. Said view is a non-associative view, that is, the graphical elements of said view are not partitioned according to the individual objects of the set, from the system standpoint. Thus, the user may not select each object of the set.

In this respect, the process may for example comprise, prior to the step of displaying, aggregating representations of respective objects of the set of objects to form the displayed view. The light view is thereby rendered more rapidly. Then, a volume is defined in the displayed view, for example through a drag and drop movement of the user pointer. Next, the process comprises querying the database to search and identify to the user objects intersecting said defined volume. Use is for example made of bounding volumes, stored in the PLM database. However, no semantic information need be first provided to or known by the user to effect the selection.

Hence, the proposed solution allows a user to rapidly display a view of the set of objects while allowing for selecting objects in the view and, if needed, loading the selected objects with their associated data in the session (design, navigation, viewing . . . ), for example through a single mouse-click. This solution is thus easy and intuitive.

Figure 1:
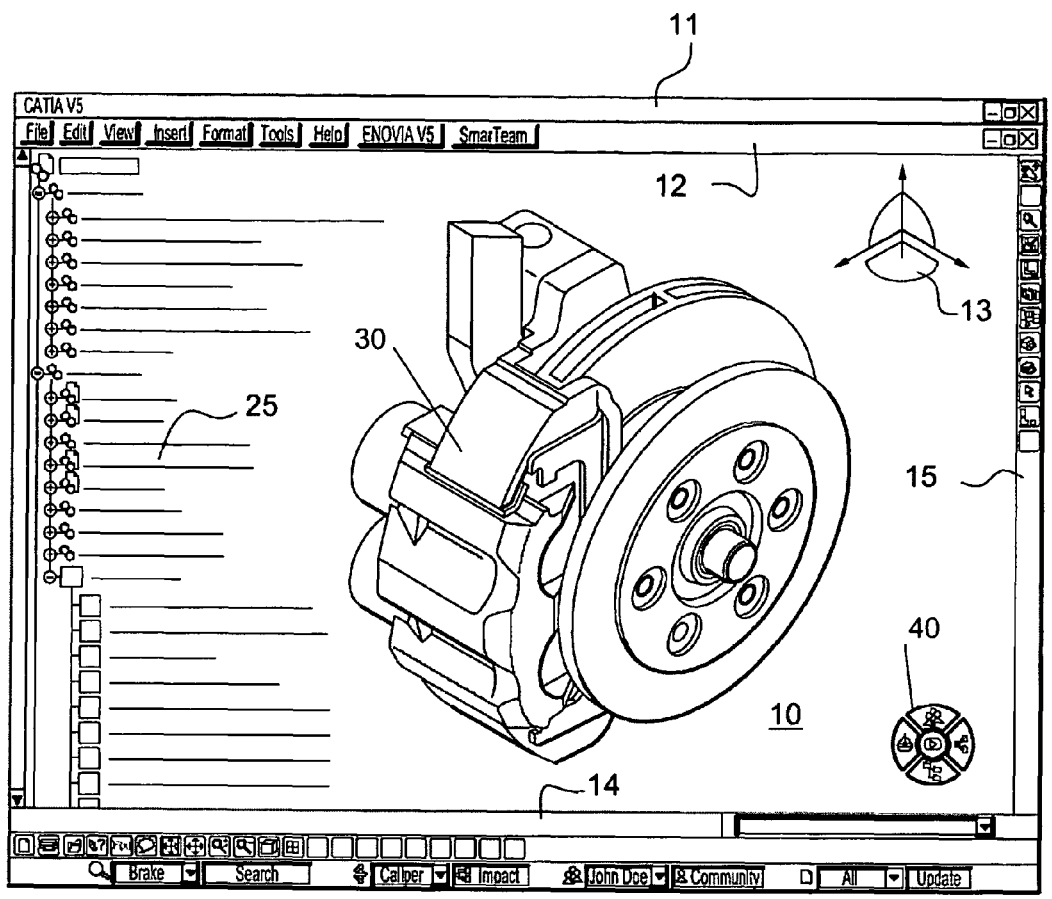
FIG. 1 is an exemplified display of a CAD-like graphical user interface.

In reference to FIG. 1, it is provided a graphical user interface with a user-controlled pointer, for example a mouse. The graphical user interface (or GUI) 10 may be a typical CAD/CAM/CAE-like interface, having standard menu bars 11, 12, as well as bottom and side toolbars 14, 15. Such menu- and toolbars contain a set of user-selectable icons, each icon being associated with one or more operations or functions, as known in the art.

Some of these icons are associated with software tools, adapted for editing and/or working on a modeled object 30 such as that displayed in the GUI 10. The software tools in question may be grouped into workbenches. Otherwise put, each workbench comprises a different subset of software tools. In particular, one of these is an edition workbench, suitable for editing geometrical features of the modeled object 30. In operation, a designer may for example pre-select a part of the object 30 and then initiate an operation (e.g. change the dimensions or any attributes, etc.) by selecting an appropriate icon. For example, typical CAD operations are the modeling of the punching or the folding of a 3D modeled object displayed on the screen.

The GUI may for example display data 25 related to the displayed object 30. In the example of FIG. 1, the data 25, displayed as a "feature tree", and their 3D representation 30 pertain to a brake assembly including brake caliper and disc. The GUI may further show various types of graphic tool 13,40, for example for facilitating 3D orientation of the object, for triggering a simulation of an operation of an edited product or render various attributes of the displayed product 30.

As an example of embodiment, the process of the invention is implemented in a computer network comprising user computers and a product data management (PDM) system. The user computers are in communication through the PDM system, allowing for the management of numerous documents, relations and data, possibly hierarchically interrelated. The PDM system may for example be located at a backbone of the network. Such a PDM system utilizes a database having data related to modeled objects, which are likely to be edited by a designer. A plurality of users may thus work in a collaborative way, on different objects (for example parts, products or assemblies of parts).

Besides, the GUI 10 and associated CAD/CAM/CAE application may be designed for allowing access to the PLM database, either on users request or as a background task, in contrast with existing CAD/CAM/CAE interfaces. Thus, in operation, a user who wishes to access the database does not have to pass from a first CAD window to a PDM window (for example by minimizing the first window and maximizing the second window) and then go back to the CAD window. Such window switching operations, frequently carried out by designers, are time consuming and particularly inappropriate in the field of CAD/CAM/CAE.

The GUI 10 is run on one user computer of the network, having a display and memory. For instance, GUIs similar to that identified by reference numeral 10 displayed in FIG. 1 may be run on other user computers of the network. These computers may further benefit from similar local CAD/CAM/CAE applications and, more generally, a common environment.

Figure 2:
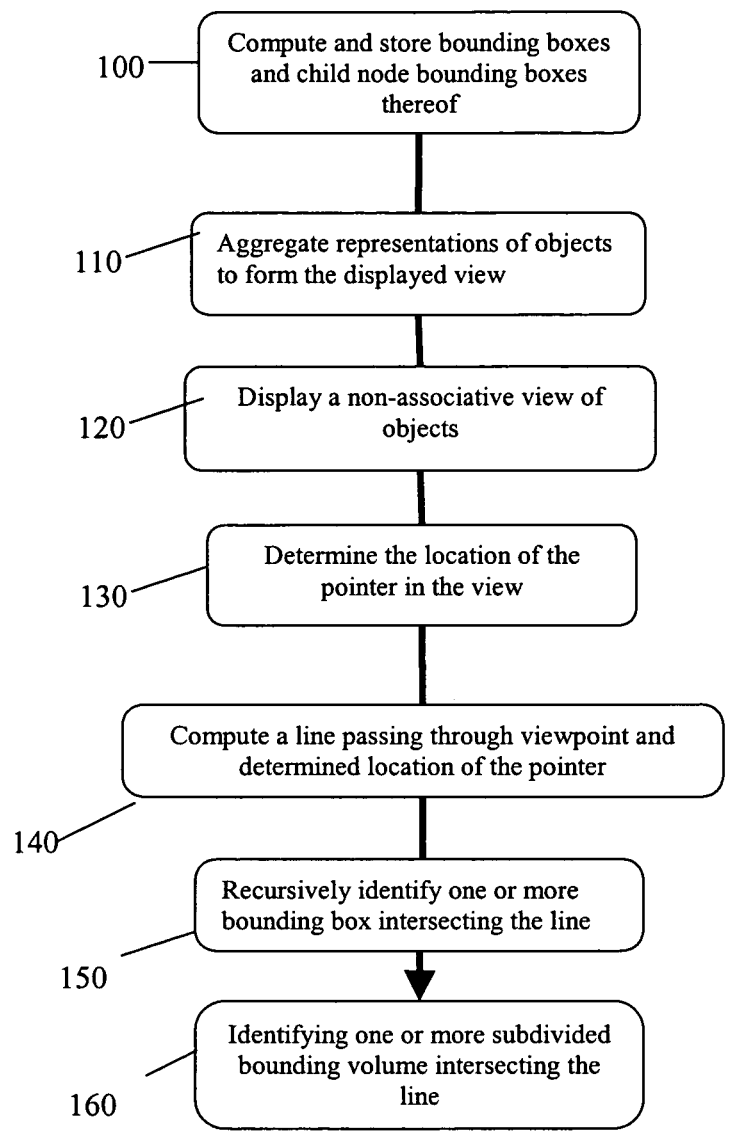
FIG. 2 shows a flowchart reflecting steps of a process for identifying an object.

In FIG. 2 is described a process to identify an object in a non-associative view. Note that the process hereafter described in reference to FIG. 2 and FIG. 4 relates to a specific way of selecting an object in the non associative view (step 130), that is, based on a determined location of the pointer in the view. Nonetheless, a description of said process will be useful for understanding the invention.

The process of FIG. 2 broadly decomposes as a build time (comprising steps 100, 110) and a run time (steps 120-160).

The build time notably comprises a pre-processing step 100, mainly dedicated to bounding volumes computation.

By "bounding volume", or bounding boxes, it is meant any mathematically simpler surface enclosing an object, for example for the purposes of culling or intersection tests. Typical bounding volumes are for example cubes, cylinder boxes or spheres. Use is made of bounding boxes in the following.

Bounding boxes of respective objects to be displayed are computed and subsequently stored in the PLM database. Such bounding boxes are stored together with a relation to their corresponding object. Geometric definitions of objects can be used to compute said boxes. The definitions used may be either the complete definitions or simplified definitions, such as the definitions of tessellated representations of said objects.

Preferably, one uses definitions of tessellated representations, which gives rise to faster computation times.

Considering a product as a hierarchy of objects, e.g. a tree, it is for example first computed boxes pertaining to terminal nodes of the tree. Product structure definitions are then used to compute (step 100) the assembly boxes, thanks to the definition of the structure and the terminal boxes already generated.

Furthermore, subdivided boxes are computed and stored in the database, together with respective parent bounding boxes. Parent bounding boxes are in this case the parent nodes of an octree, that is, a tree data structure wherein each parent node has eight child nodes, which together partition the volume of space of the parent node. Thus, each node of the tree represents a cuboid volume, e.g. a subdivided bounding volume. Several subdivisions can be contemplated (parents, children, children's children, etc.), depending on the desired resolution.

Moreover, only one bounding box is preferably stored for multi-instantiated objects of the set of objects. That is, bounding boxes are computed for the references only. In this case, instances of a same reference are likely to be stored together with a position matrix (or a link thereto). Hence, in operation, a box may be equated on-the-fly to any of the multi-instantiated objects upon a simple Cartesian system change.

Next, the application or the system may, at step 110, proceeds to aggregate representations of objects of the set of objects, in order to form a view to be rendered next. This step occurs preferably during the build time, thus avoiding repetitions. It may however alternatively be carried out upon instruction of a user to open a file corresponding to a set of objects (s)he wishes to view.

The view obtained, i.e. the aggregated representations, preferably form a simplified representation of the set of objects that will be used in the invention. To achieve this, it may for example be used simplified product structure definitions. However, one keeps in mind that the final view does not contain information on said product structure. Such a view is known as a non-associative view. Notice that said view may be simplified based on various criteria, such as a threshold size (possibly user parameterized) or sag, that is, an entry parameter used for tessellated representations of the objects, as known in the art. Hence, not all the parts of the set need be used during the aggregation (for example, rivets of a plane would be discarded if the entire airplane is displayed). Further, parts contained in other parts (therefore masked) need not be used in the aggregation. Other criteria may be used to discard some of the objects, for example user selectable categories of parts.

Notice that the representations of objects, which are used to form the simplified view, may consist in simplified representations like simplified tessellated representations stored in the database together with relations to their respective object.

Next, during the run-time beginning at step 120, the view of the set of objects is displayed in the GUI, showing the set of objects in a given orientation. Said view will hereafter denoted as the "reference view", corresponding to said given orientation of the set of objects.

As a result of the aggregation step, the obtained view is a non-associative view. As said before, this means that the graphical elements forming the view are not partitioned according to the individual parts of the set of objects, from the system standpoint. Thus, the set of objects as represented in the view is not content addressable and a user may not select any individual object composing the set displayed in the view. For example, neither a bitmap nor raster image is content addressable with respects to represented objects. A vectorial view is conceptually different as it is partitioned into various drawing elements. It is notwithstanding an example of non-associative view in the sense of the invention inasmuch as the drawing elements are not associated to the various parts of the set of objects stored in the PLM database.

Rendering a non associative view makes a critical difference in terms of memory required to display the view, at least in the world of CAD/CAM/CAE. Indeed, while the aggregated view typically requires a few hundreds of kilobytes (for example 100-300 KB, depending on the desired definition), a view containing superimposed representations of the parts may require up to thousands of megabytes to be loaded in the computer memory. Thanks to the aggregation step, the view is more rapidly rendered and the user can more rapidly navigate in this view, for example through zoom-in/out and displacements, thanks to suitable tools available from the GUI.

However, since the displayed view is not associative, the various parts composing the set are not individually selectable, at least not directly. Hence, a specific scheme must be implemented, as will be explained now.

At step 130, the location of the pointer in the view is determined, that is, the x,y location of the pointer in the screen. Any known convenient method can be used to carry out that step 130.

Next, at steps 140-160, the system proceeds to search the database and identifies to the user one object according to the determined location. Such steps are detailed now, according to some specific embodiments of the process of FIG. 2.

First, at step 140, it is computed a ray or any geometrical equivalent passing through a viewpoint of the view and a determined x,y location of the pointer in the screen. Here the viewpoint depends on the perspective choice used for the representation, in a 3D context. It may be the vanishing or camera station point, as known in the art, or any other type of perspective.

Next, at step 150, it is identified one or more bounding boxes of a respective object of the set of objects, intersecting the computed ray. To this aim, several known techniques might be used to determine whether an intersection exists or not. For example, thanks to the viewpoint and the pointer location first determined on the screen, it may be determined whether the ray intersects a bounding box.

In a brute force method, the algorithm may for example scan all bounding boxes corresponding to each child instance of the reference view, in order to determine which boxes intersect said computed ray. This step is carried out in the coordinate system of the reference view.

However, the above scan step becomes rapidly prohibitive as the number of objects increases. For example, CAD/CAM modeling of a modern airplane may require storing up to 3 millions boxes. Hence, one understands that it would be advantageous to speed up the intersection research algorithm.

In this respect, one may for example use the so-called R-tree technique, that is, a spatial access method, wherein space is split with hierarchically nested, possibly overlapping boxes. Such a technique leads to more balanced feature trees according to various possible criteria, leading to more efficient scans.

Next, once an intersection with a child instance of the reference view has been found, the initial ray is recomputed in the coordinate system of said intersected child instance and a new scan is performed within child instances thereof, etc. until no more intersection is found.

Figure 3A:
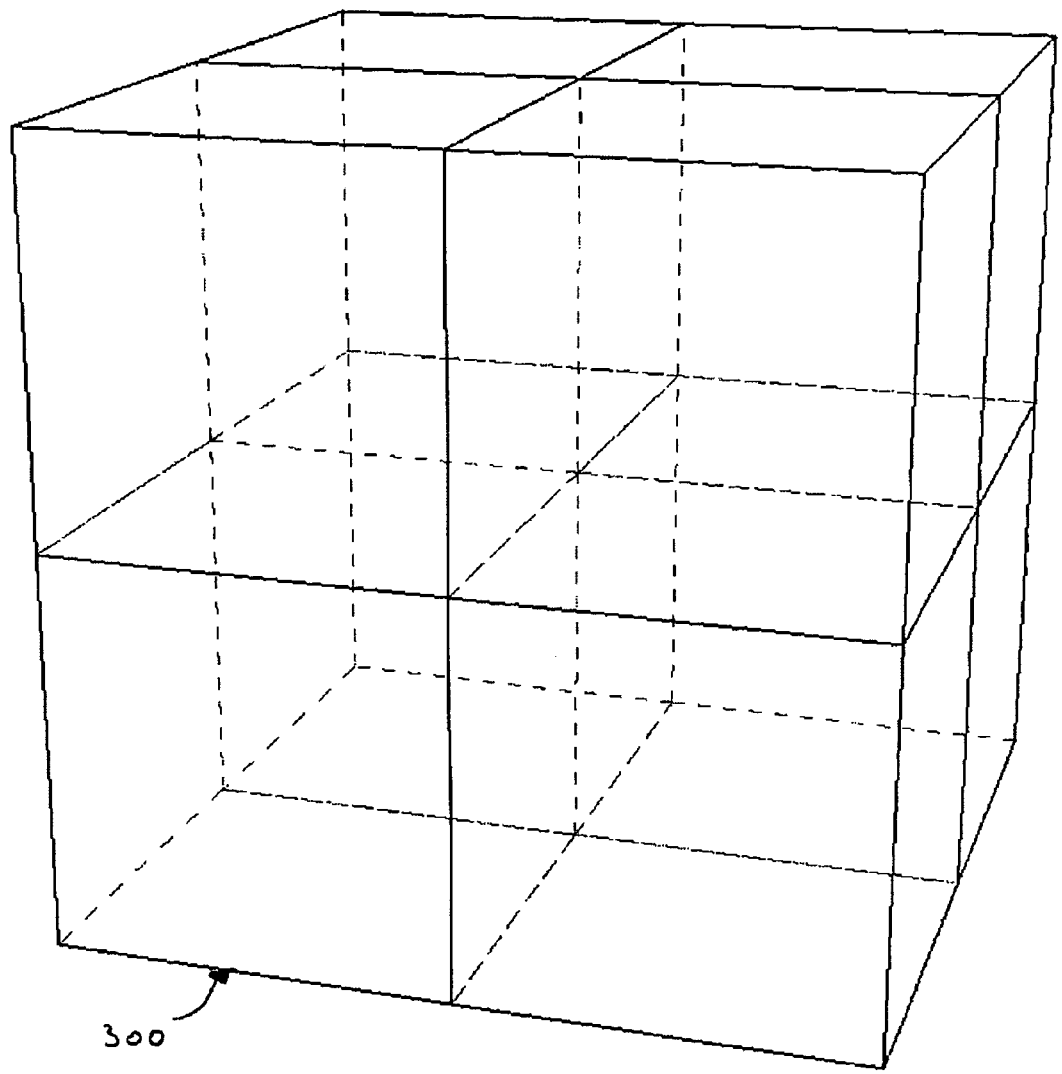
FIGS. 3a and 3b show an octree used in the process according to an embodiment of the invention.

The intersection research algorithm is thus recursive (steps 150-160), that is, it is searched the last intersected child of an $n^{th}$-order intersected parent box, and runs as follows:

Once an intersecting bounding box is detected, the process according the one embodiment of the invention works at a smaller subdivision level within the intersected bounding box. For example, one may consider the octrees, which are volumes dividing in eight a cubic box as shown in FIG. 3a.

Figure 3B:
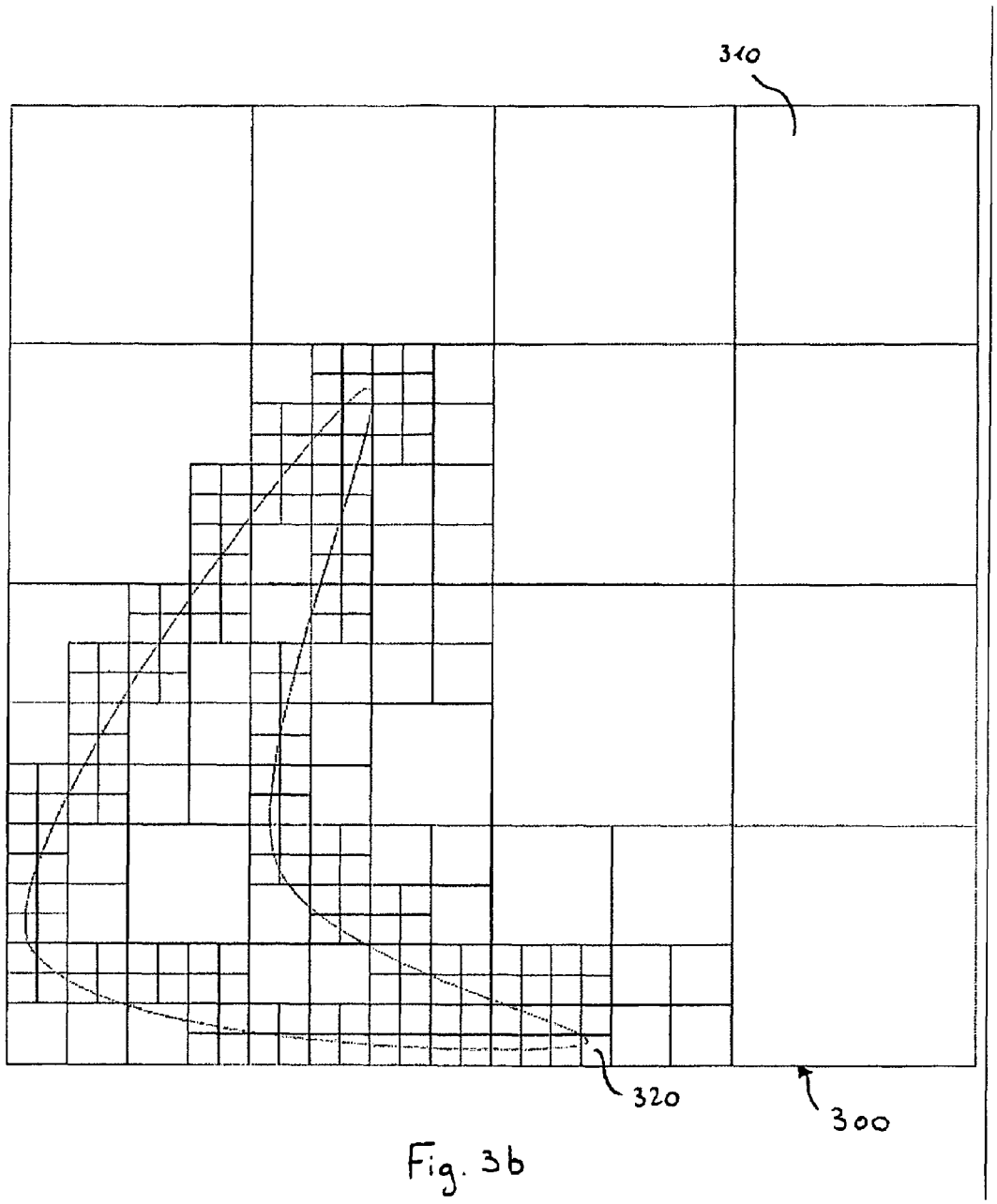

Octrees 300 are themselves for example further subdivided, as shown in FIG. 3b (represented in two dimension for the sake of clarity) except if an octree 310 does not contain any element of a model or is completely filled with an element of a model. Each octree 300 containing an element of the model is further subdivided.

The octrees 300 are therefore scanned to detect any intersection with the computed ray, until the smallest undivided volume, known as a voxel 320 (which size may depend on the definition input by the user). The process then stops and the object in the view that is inside or close to the identified voxel is selected.

Once an object is selected, the distance of the corresponding voxel to the viewpoint is stored. Then, the process recursively tests the other bounding boxes (steps 150-160) according to the same steps (bounding boxes, octrees, voxels) to find and select the object that would be the closest to the viewpoint (along the ray). In order to optimize the process, if a bounding box does not intersect the computed ray (in the new coordinate system), then that bounding box is discarded. Identically, if a bounding box is intersected by the ray but the distance between that bounding box and the viewpoint is greater than the previously stored distance, then said bounding box will not be further tested.

Once all the bounding boxes are tested and an object is identified in the database, an exact representation of said object (for example the exact tessellated representation or a NURBS representation) is loaded from the database and displayed, superimposed to the global representation of the displayed assembly comprising the selected object.

Said selected object may for example be highlighted, or displayed with is real attributes (color, texture, material . . . ) and the other objects of the non-associative view may be rendered with different rendering parameters. For example, the non-identified (or non-selected) objects may be made translucent to better identify the selected object. Additionally, other retrieved information may be displayed next to the identified part or in the feature tree 25, such as its name, owner, or any other attributes, the representation of said object in the feature tree being, for example, highlighted.

The global view is thus still a non-associative view, except for the selected object which is fully defined and represented.

This process is carried out on-the-fly: each movement of the pointer triggers a new query in the database according to the new position of the pointer, and then the selection and loading of a new object.

Figure 4:
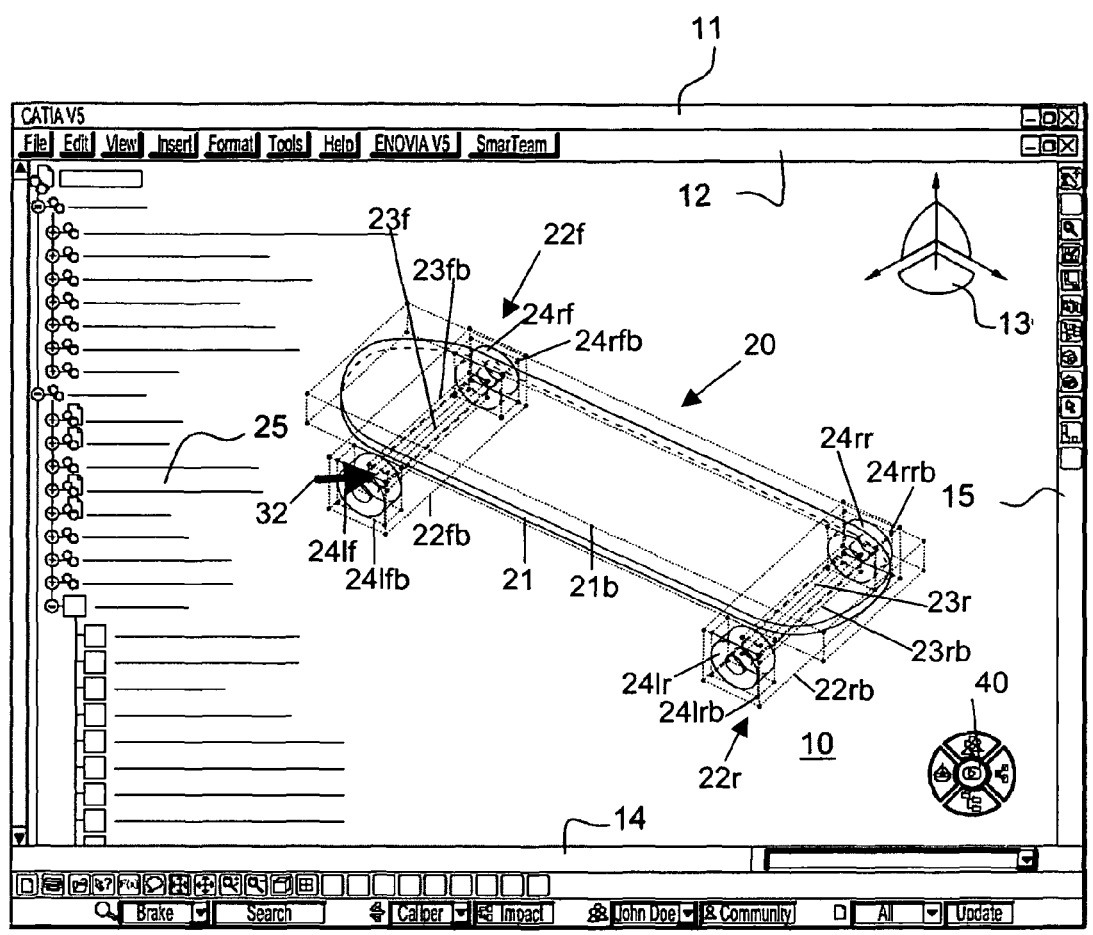
FIG. 4, shows a view of a set of object displayed in the graphical user interface of FIG. 1.

An embodiment of the above process will be illustrated now, in reference to FIG. 4, showing a modeled object displayed in the same graphical user interface as in FIG. 1. Notice that bounding boxes are depicted in dotted lines in FIG. 4, as a guide for the eyes only.

Here the GUI 10 has menu and toolbars similar to those already described in reference to FIG. 1. The GUI 10 displays a simplified non-associative view of a skateboard 20, composed of a board 21, a front (f) and rear (r) trucks 22$f$, 22$r$. The trucks comprise respective shafts 23$f$, 23$r$ and left (l) and right (r) wheels 24$lf$, 24$rf$, 24$lr$, 24$rr$ ("lf" is for left-front, "rf" for right-front, etc.). Respective bounding boxes (b) are depicted under similar references 21$b$, 22$fb$, 22$rb$, 23$fb$, 23$rb$, 24$lfb$, 24$rfb$, 24$krb$ and 24$rrb$. In particular, some of the boxes correspond to terminal nodes, e.g. a wheel, a shaft and the board while other boxes correspond to some assemblies of parts (for example the trucks). Said boxes are computed according to product structure definitions, as explained above.

In operation, a user who whishes to select the left-front wheel 24$lf$ positions the pointer 32, e.g. thanks to a mouse, thereon.

Then, according to the method, it is determined the location of the pointer in the view and a query in the database is triggered. A ray passing through the viewpoint and the location of the pointer is computed as described above. All child instances of the set 20 forming the skateboard are then scanned. Since, in this example, an intersection is found with box 22$fb$ (corresponding to the front truck 22$f$), the routine continues, switching to the system coordinate of box 22$f$. Non-intersected boxes are discarded.

Next, owing to the "is composed of" relation, it is then tested whether said ray intersects any of the boxes 23$fb$, 24$rfb$ and 24$lfb$. An intersection is found with boxes 23$fb$ and 24$lfb$, that is, corresponding to the front shaft, e.g. an instance of the reference "shaft", and left wheel, e.g. an instance of the reference "wheel". The hierarchical descent then stops as no more instance is found to compose the intersected instance. Next, the routine compares respective distances to the viewpoint and, provided accuracy criteria are met, finally returns the wheel 24$lf$ as an active part (selected). A criterion may for example be the part which is the closest to the "eye" of the user. According to the process, the system then retrieves from the database an exact representation of the part and possibly all data associated to the selected part (TBC), said exact representation being superimposed on the displayed non-associative view.

Notice that, owing to the product structure definitions stored in the database, the result of the query is an occurrence, that is, an instance path. In this respect, in the previous example, the result of the query is not simply the front left wheel 24$lf$ but rather the "left wheel" instance of the reference "wheel", in the "front truck" instance of the reference "truck".

Therefore, the process according to an embodiment may also provide the display of said occurrence, for example next to the identified object.

Since all the nodes of the feature tree representing the model has a representation, preferably a 3D representation in the database, the system may display a graphical representation of the path that leads to the identified object. This can for example be implemented through a serial of thumbnails, each thumbnail representing a level of the path. In the above described case (selection of wheel 24$lf$), the system would display:

a thumbnail showing the 3D representation of the skateboard 20,
a thumbnail representing the front truck, and
a thumbnail representing the wheel, wherein each thumbnail of the path being user selectable. Selection thereof would result in loading the required object in the session. How the path of an object is graphically identified helps the user in understanding the structure of the model. The process of displaying a graphical representation of the path may be activated through the selection of an option, for example thanks to the compass 40.

Note that, in an embodiment, further selection (for example by simply clicking) of an identified part may open an edition window, with the selected part rendered therein, ready for edition.

In another embodiment, one may contemplate executing an "add" command in order to add the selected part in an editing window already open, or adding the selected part to a viewing session or the like.

Thus, the process described in reference to FIG. 2 can be seen as a pre-selection method, and the final selection of the object is only carried out upon activation of the pointer pointing the identified object.

The example of FIG. 4 is obviously very simple, for the purpose of understanding. However, referring back to the flowchart of FIG. 2, in case of several bounding boxes are found, an additional scheme may possibly be implemented to clearly distinguish boxes as seen above.

In particular, if several voxels are found to intersect the ray, then the closest to the viewpoint would be identified as the one to be selected, etc.

Hence, in an embodiment, said process allows the user to directly select and retrieve a part, ready for edition, from the database. This is achieved by designating said part in a simplified 3D representation displayed on the screen, where no semantic information is available or required. No knowledge about the filename or other attribute of the part is needed from the user. The process provides simplicity and fastness for both casual and expert user. Indeed, this process is intuitive, no know-how is required (at variance with filtering steps of the prior art). Only a designation of the part, for example thanks to the position of a pointer, is required from the user; the part may thus be quickly selected. As a result, the part may be loaded, instead of loading all parts or all parts matching a given volume. Such an approach is further highly scalable, so that access to 3D data in 3D navigation on a light device (personal computers) becomes possible.

Since, in an embodiment, the queries to the database are triggered each time the pointer is moved, one may wish to use the selection method only when requested. To that end, in one embodiment, the user may activate the selection method by activating a search mode thanks, for example, to a user selectable area of the toolbar 14.

Optionally, the user may wish to know the objects that are in contact with a targeted object. Then, (s)he (s)he may activate an option where all the objects that are in contact with the identified object are also highlighted and upon activation of the pointer those objects may also be retrieved from the database and loaded in the session (design, review . . . ), as it will be described below.

Figure 5:
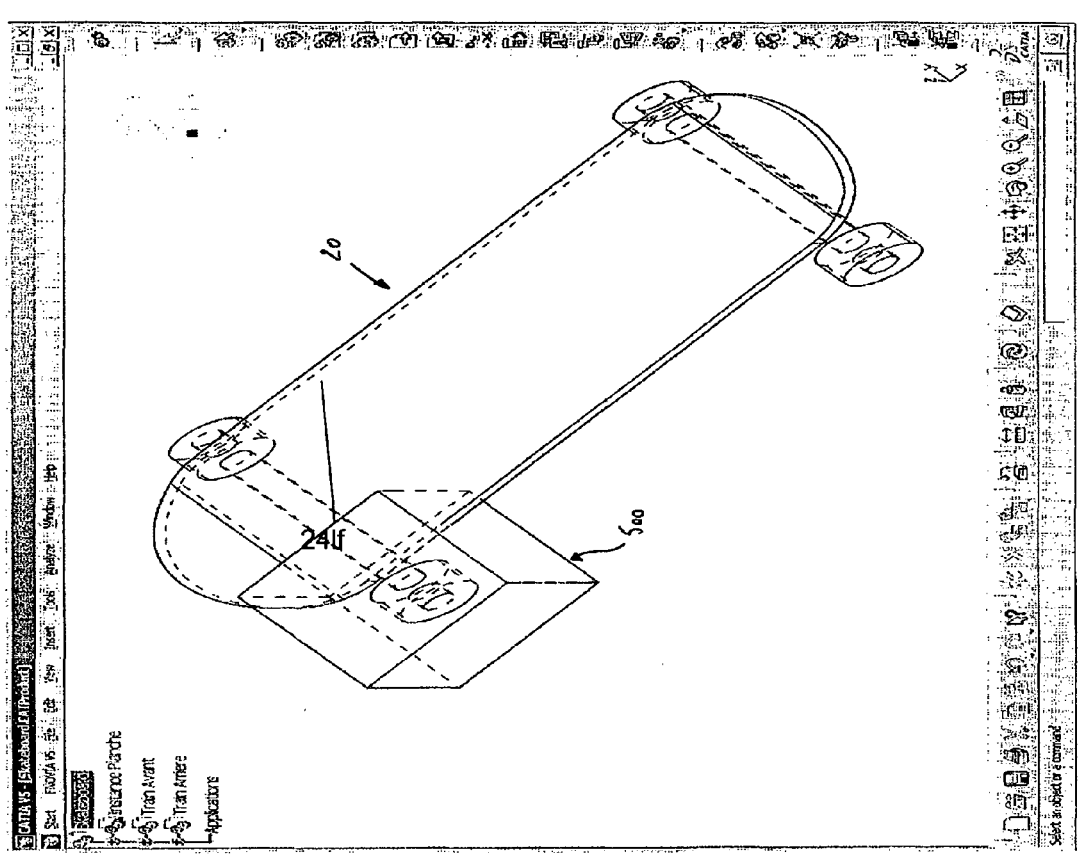
FIG. 5 shows a view of an embodiment of a selection process according to the invention.

According to an embodiment of the invention shown in FIG. 5, the user may not be sure of the part (s)he wishes to select, or may wish to retrieve a set of objects in order to work on a complete environment. Therefore, the user may decide to trigger a volume query in order to retrieve all the parts (terminal nodes or not of the feature tree) intersecting the user-defined volume.

As shown in FIG. 5, the user may wish to retrieve all the objects of the skateboard 20 contained in the volume 500 (in this example, the objects to be retrieved include the left front wheel 24*lf* and the front shaft 23*f*).

Figure 6:
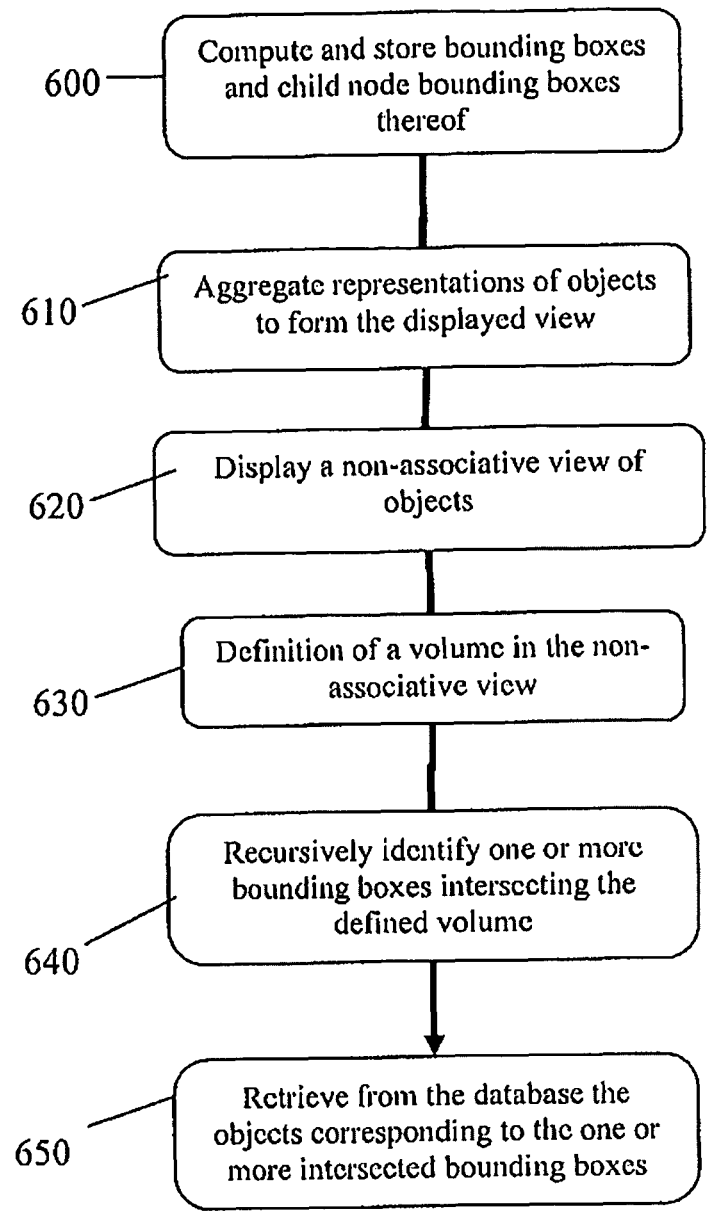
FIG. 6 shows a flowchart reflecting the process according to an embodiment of the invention.

FIG. 6 shows a flowchart detailing the process of the invention implemented during the volume query.

Steps 600-620 correspond to steps 100-120 described in connection with FIG. 2. Once the bounding boxes are computed and stored (once for all), the non-associative view is created and displayed as seen in FIG. 2. Then, the user may define a volume basis of the search in the database (630). The volume may be a cubic box like the one 500 represented in FIG. 5, a sphere, a cylinder or the like. The definition of the volume may be implemented through various ways.

In a first embodiment, the user may activate the pointer (through a mouse click for example) on the simplified non-associative view and drag the pointer in order to create a volume such as a sphere. The more the pointer is dragged, the bigger the volume is. Once the pointing device is released (like in a "drag and drop" process), a query to the database is triggered in order to identify all the parts intersecting the sphere using the previously defined bounding boxes (step 640). This enables the user to rapidly, easily and intuitively define a required volume thanks to a graphical feedback of the size of said volume.

In a second embodiment, the user defines the volume thanks to a dedicated user interface where some pre-defined value are presented to the user, said user being able to modify the values (height, width, radius . . . ). Once the volume is defined and displayed in the non-associative view, queries are triggered in the database to retrieve the exact representations of the identified objects.

In a third embodiment, the definition of the volume may use the computed ray previously described (step 140, FIG. 2). Once an object is identified according to the process described in connection with FIGS. 2 to 4, the user may input an offset distance in order to increment the size of the identified object. This way, the user defines a volume that may be used for a next volume query, enabling for example to retrieve all the objects close to the previously identified objects (within a predetermined distance, namely the offset distance).

Once a set of objects are identified through the process of step 640, said identified objects are for example highlighted and their respective exact representations are retrieved from the database (step 650). Those representations are therefore superimposed on the simplified non-associative representation already displayed. As seen before, in another embodiment of the invention, the exact representations of the identified objects are loaded and the other objects in the view are rendered with different rendering parameters, for example the non-identified objects may be made translucent in order to better distinct the retrieved objects.

In the same time or as an alternative, the feature tree 25 may be updated thanks to the result of the query. Then, the user is able to have the name, and possibly other attributes of the identified objects displayed in the view, and the number of parts identified.

The volume defined in step 630 may also be moved in the view, triggering at each movement a new query in the database. The result in the view (loading of the exact representations and/or modification of the feature tree 25) is then updated on-the-fly. When the user is satisfied with the result of the query that can be seen as a pre-selection, (s)he may select the set of objects identified, for example by clicking on a user selectable area placed next to the volume defining the query.

Therefore, those objects are loaded in a current session of the user, for example a design session, a reviewing session or the like.

The process of the invention enables the user to easily identify the objects (s)he may need in his session, without the need to load from the database a complete model in his session or to know the names of the parts (s)he wishes to modify or to work on.

According to another embodiment, the user may wish to know all the parts that are in contact with a selected part, or in the vicinity of an identified part.

To that end, the user may previously activates an option, for example by selecting a user-selectable icon of the compass 40. Then, each time the pointer 32 identifies an object, or if a set of objects is identified in the case of a volume query, the number, and possibly the respective names, of the objects that are in the vicinity of the identified objects are identified to the user and their respective exact representations are retrieved from the database and displayed in the view. This may help, for example, the user to find the object is looking for more quickly, or to be indicated other objects that may be impacted in case of the identified object is modified.

If the user activates the pointer (click) or a dedicated user-selectable area, then all the objects (e.g. the object identified through the process and their neighboring objects) are then loaded in the work session of the user.

The invention is not limited to the preferred embodiments described above, in reference to the drawings. In particular: a mixed representation may be contemplated when displaying a view on the GUI. Said view may hence remain a non-associative view as regards a particular set of objects while other objects could be loaded in the view with respective attributes allowing direct selection thereof. For example, a representation of said other objects may comprise a set of hyperlinks to the database. Thus, clicking a suitable zone which corresponds to a hyperlink allows a respective part to be directly selected. In contrast, as regards representations without hyperlink, the algorithm described above (e.g. finding the intersection of a volume on the 3D representation) may be used for selection. Yet, it might be contemplated to switch from a first selection process (finding the intersection of a volume in the 3D representation) to a second process (finding the location of the pointer in the 3D representation).

We claim:

1. A process for selecting three-dimensional (3D) modelled objects in a product lifecycle management database containing 3D modelled objects, the process comprising:
   providing a graphical user interface;
   displaying on the graphical user interface a 3D view of a set of 3D modelled objects of the product lifecycle management database, said 3D view being a non-associative 3D view, wherein graphical elements of the displayed 3D view are not partitioned according to the individual objects of the set of 3D modelled objects in the 3D view;
   defining and placing, upon user action, a volume in the displayed 3D view, wherein the defined volume is extrinsic to the set of 3D modelled objects;
   searching, in the product lifecycle management database, 3D modelled objects of the 3D view intersecting said defined extrinsic volume; and
   identifying, to the user, the 3D modelled objects of the 3D view that intersect said defined extrinsic volume, wherein the step of identifying is carried out recursively, based on relations stored in the product lifecycle management database between the respective 3D modeled objects.

2. The process of claim 1, wherein the step of identifying objects comprises:
retrieving from the database the exact representation of said identified objects.

3. The process of claim 2, wherein the step of identifying further comprises:
applying to non-identified objects of the non-associative view rendering parameters that are different from the rendering parameters of the identified object.

4. The process of claim 3, wherein the rendering parameters applied to the non-identified objects of the non-associative view comprise rendering translucent all non-identified objects of the non-associative view.

5. The process of claim 1, further comprising, prior to the step of displaying:
aggregating representations of respective objects of the set of objects to form the non-associative displayed view.

6. The process of claim 1, wherein the step of searching and identifying further comprises:
identifying one or more bounding volume of respective objects of the set, intersecting the defined volume.

7. The process of claim 6, further comprising, prior to the step of displaying the non-associative view:
computing and storing in the PLM database the bounding volumes of respective objects.

8. The process of claim 7, wherein at the step of computing and storing bounding volumes, only one bounding volume is stored for multi-instantiated objects of the set of objects.

9. The process of claim 6, wherein the step of identifying one or more intersecting bounding volume is carried out recursively, based on relations stored in the database between the respective objects.

10. The process of claim 6, further comprising, prior to the step of displaying:
computing and storing in the PLM database subdivided bounding volumes of respective bounding volumes.

11. The process of claim 10, further comprising:
identifying one or more subdivided bounding volume intersecting the defined volume.

12. The process of claim 1, wherein upon activation of a user-selectable area, said identified objects are loaded on an authoring tool in order to be edited.

13. The process of claim 1, wherein the objects in contact with the identified objects are also identified.

14. The process of claim 1, wherein the volume is defined through a drag and drop movement of a pointer in the displayed non-associative view.

15. The process of claim 1, wherein the volume is defined by an offset of the volume of an identified object of the view, said object being identified through the computation of the intersection between the set of objects in the view and a computed ray passing through the viewpoint of the view and a location of a pointer in the view.

16. The process of claim 1, wherein the identification of the identified objects is updated upon movement of the defined volume in the non-associative view.

17. Apparatus for selecting a three-dimensional (3D) modelled object in a product lifecycle management database containing 3D modelled objects, the apparatus comprising a processor including:
means for providing a graphical user interface on a display;
means for displaying on the graphical user interface a 3D view of a set of 3D modelled objects of the product lifecycle management database, said 3D view being a non-associative 3D view, wherein graphical elements of the displayed 3D view are not partitioned according to the individual objects of the set of 3D modelled objects in the view;
means for defining and placing, upon user action, a volume in the 3D view, wherein the defined volume is extrinsic to the set of 3D modelled objects; and
means for searching, in the product lifecycle management database, 3D modelled objects of the 3D view intersecting said defined extrinsic volume; and
means for identifying, to the user, the 3D modelled objects that intersect the defined extrinsic volume,
wherein the means for identifying is carried out recursively, based on relations stored in the product lifecycle management database between the respective 3D modeled objects.

18. The apparatus of claim 17, wherein the means for identifying objects comprise means for retrieving from the database the exact representation of said identified objects.

19. The apparatus of claim 17, further comprising means for loading said identified object on an authoring tool in order to be edited, upon activation of user-selectable area.

20. A computer program, stored on a non-transitory computer readable medium, for selecting a three-dimensional (3D) modelled object in a product lifecycle management database containing 3D modelled objects, comprising code means for causing a computer onto which said computer program is loaded to take the steps of:
providing a graphical user interface;
displaying on the graphical user interface a 3D view of a set of 3D modelled objects of the product lifecycle management database, said 3D view being a non-associative 3D view, wherein graphical elements of the displayed 3D view are not partitioned according to the individual objects of the set of 3D modelled objects in the 3D view;
defining and placing, upon user action, a volume in the 3D view, wherein the defined volume is extrinsic to the set of 3D modelled objects; and
searching, in the product lifecycle management database, 3D modelled objects of the 3D view intersecting said defined extrinsic volume; and
identifying, to the user, the 3D modelled objects of the 3D view that intersect said defined extrinsic volume,
wherein the step of identifying is carried out recursively, based on relations stored in the product lifecycle management database between the respective 3D modeled objects.

21. The computer program of claim 20, wherein the code means causing the computer to take the step of identifying objects comprise code means for causing the computer to take the step of retrieving from the database the exact representation of said identified objects.

22. The computer program of claim 20 comprising code means for causing the computer, upon activation of user-selectable area, to take the step of loading said identified objects on an authoring tool in order to be edited.

23. A process for selecting three-dimensional (3D) modelled objects in a product lifecycle management database containing 3D modelled objects, the process comprising:
providing a graphical user interface;
displaying on the graphical user interface a 3D view of a set of 3D modelled objects of the product lifecycle management database, said 3D view being a non-associative 3D view, wherein graphical elements of the displayed 3D view are not partitioned according to the individual objects of the set of 3D modelled objects in the view;

defining and placing, upon user action, a volume in the displayed 3D view, wherein the defined volume is extrinsic to the set of 3D modelled objects; and searching, in the product lifecycle management database, 3D modelled objects of the 3D view intersecting said defined extrinsic volume; and identifying, to the user, the 3D modelled objects of the 3D view that intersect said defined extrinsic volume, wherein the step of searching and identifying is carried out recursively, based on relations stored in the product lifecycle management database between the respective 3D modeled objects, and further comprises identifying one or more bounding volume of 3D modeled respective objects of the set, intersecting the defined extrinsic volume.

24. A process for selecting three-dimensional (3D) modeled objects in a product lifecycle management database containing 3D modeled objects, the process comprising:

providing a graphical user interface;

displaying on the graphical user interface a 3D view of a set of 3D modeled objects of the product lifecycle management database, said 3D view being a non-associative 3D view, wherein graphical elements of the displayed 3D view are not partitioned according to the individual objects of the set of 3D modeled objects in the view;

defining and placing, upon user action, a volume in the displayed 3D view, wherein the defined volume is extrinsic to the set of 3D modeled objects;

searching, in the product lifecycle management database, 3D modeled objects of the 3D view intersecting said defined extrinsic volume;

identifying, to the user, the 3D modeled objects of the 3D view that intersect said defined extrinsic volume; and identifying one or more bounding volume of respective 3D modeled objects of the set, intersecting the defined extrinsic volume, wherein the step of identifying one or more intersecting bounding volume is carried out recursively, based on relations stored in the product lifecycle management database between the respective 3D modeled objects.

* * * * *